(12) United States Patent
Hibino

(10) Patent No.: US 6,181,625 B1
(45) Date of Patent: Jan. 30, 2001

(54) SEMICONDUCTOR STORAGE MEMORY HAVING A REFERENCE VOLTAGE GENERATION CIRCUIT GENERATING THE WORD LINE VOLTAGE

(75) Inventor: Kenji Hibino, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/417,240

(22) Filed: Oct. 12, 1999

(30) Foreign Application Priority Data

Oct. 14, 1998 (JP) .................................................. 10-292555

(51) Int. Cl.[7] ...................................................... G11C 7/02
(52) U.S. Cl. ........................ 365/210; 365/189.09; 365/200
(58) Field of Search ............................... 365/189.09, 210, 365/208, 200, 185.2

(56) References Cited

U.S. PATENT DOCUMENTS

| | | | |
|---|---|---|---|
| 4,653,023 | * 3/1987 | Suzuki et al. ........................ | 365/104 |
| 4,802,138 | * 1/1989 | Shimamune ........................ | 365/210 |
| 5,025,417 | * 6/1991 | Miyamoto et al. ............. | 365/189.09 |
| 5,936,888 | * 8/1999 | Sugawara ........................ | 365/185.2 |
| 5,963,484 | * 10/1999 | Jung .................................. | 365/189.09 |

* cited by examiner

*Primary Examiner*—David Nelms
*Assistant Examiner*—Thong Le
(74) *Attorney, Agent, or Firm*—Young & Thompson

(57) ABSTRACT

It is an object of the present invention to prolong the life, and increase the reliability, of a reference voltage generation circuit which generates word line voltages for use in a mask ROM which uses the multiple-valued technology. The circuit, which uses series-connected P-channel MOS transistors P1, P2, . . . Pm and parallel-connected dummy cell transistors C21, C22, . . . C2n to generate a reference voltage T2V at the node point, has dummy cell transistors C01, C02, . . . C0n, with a threshold value lower than that of the dummy cell transistors C21, C22, . . . C2n, between the output end of the reference voltage T2V and the dummy cell transistors C21, C22, . . . C2n.

6 Claims, 9 Drawing Sheets

FIG.9

|     | φ1  | φ2  | φ3  |
| --- | --- | --- | --- |
| Vt3 | off | off | off |
| Vt2 | off | off | on  |
| Vt1 | off | on  | on  |
| Vt0 | on  | on  | on  |

SEMICONDUCTOR STORAGE MEMORY HAVING A REFERENCE VOLTAGE GENERATION CIRCUIT GENERATING THE WORD LINE VOLTAGE

BACKGROUND OF THE INVENTION

1. Field of the Invention

The present invention relates to a semiconductor storage device, and more particularly to a reference voltage generation circuit which generates the word line voltage of a semiconductor storage device which stores multiple-bit data in one memory cell.

2. Description of the Prior Art

Recently, in response to the request for a large-capacity semiconductor storage device, a semiconductor storage device which stores multiple-bit data in one cell with the use of the multiple-value technology has received much attention. The multiple-value technology will be described with a mask ROM as an example.

A mask ROM using the multiple-value technology must store multiple-bit (for example, two-bit or four-bit) data in one memory cell transistor. To do so, the threshold voltage of each memory cell transistor must be set to one of four or more threshold voltages according to the data to be stored. For example, to store two-bit data in one memory cell transistor, the threshold voltage must be set to one of $2^2=4$ types of threshold voltages according to the data to be stored; to store four-bit data in one memory cell transistor, the threshold voltage must be set to one of $2^4=16$ types of threshold voltages according to the data to be stored. The threshold is set up by the ion implantation technology during manufacturing.

Data is read from a memory cell transistor, which stores multiple-but data, as described below.

For a mask ROM which does not use the multiple-value technology, that is, a mask ROM which stores one-bit data in one memory cell transistor, one voltage level need be applied to a word line. This is because, in order to store one-bit data in one memory cell transistor, one of two threshold voltage levels need be set up for data to be stored. This means that applying the intermediate of the two threshold voltage levels to the word line indicates which threshold voltage level the memory cell transistor has. In this case, the memory cell transistor having one of two threshold values is set to ON, and the memory cell transistor having the other threshold value is set to OFF. Therefore, data may be read from the selected memory cell.

However, for a mask ROM using the multiple-value technology, each memory cell transistor has four or more threshold voltage levels. Therefore, to check the threshold voltage each memory cell transistor has, it is necessary to apply multiple levels of voltage to the word line one after another. For example, when one memory cell transistor contains two-bit data, that is, when the memory cell transistor has four threshold voltage levels, Vt0, Vt1, Vt2, and Vt3, it is necessary to apply the intermediate voltage (T1V) of Vt0 and Vt1, the intermediate voltage (T2V) of Vt1 and Vt2, and the intermediate voltage (T3V) of Vt2 and Vt3, one after another, to the word line to check which threshold voltage level the memory cell transistor has. This means that a mask ROM storing two-bit data in one memory cell transistor requires a circuit which generates three levels of word line voltage.

Similarly, when one memory cell transistor contains four-bit data, the mask ROM requires a reference voltage generation circuit which generates 15 (16−1) levels of word line voltage.

Although many circuits which generate these reference voltages have been introduced, the threshold voltage of a memory cell transistor is not always a desired threshold voltage because of manufacturing process problems. This means that the relation between the reference voltage and the memory cell transistor threshold voltage is not always a desired relation because of manufacturing problems.

SUMMARY OF THE INVENTION

In view of the foregoing, it is an object of the present invention to provide a semiconductor storage device capable of making the relation between the reference voltage and the memory cell transistor threshold voltage a desired relation.

The present invention provided a semiconductor storage device which supplies voltage developed at an output end to word lines, the semiconductor storage device comprising resistor means connected between a first power source end and the output end; and first and second dummy cell transistors connected in series between a second power source end and the output end, wherein the first dummy cell transistors and the second dummy cell transistors are manufactured in the same manufacturing process. Preferably, the gates of the first and second dummy cell transistors are connected to the output end. In addition, the threshold voltage of the first dummy cell transistors and the threshold voltage of the second dummy cell transistors are preferably different.

The present invention also provides a semiconductor storage device comprising a memory cell array composed of a plurality of memory cell transistors; a plurality of word lines each of which selects one of the plurality of memory cell transistors; an X decoder which activates a predetermined word line out of the plurality of word lines in response to an address signal; and means for supplying a reference voltage to the predetermined word line that is activated, wherein the means for supplying the reference voltage comprises resistor means connected between a first power source end and an output end; first and second dummy cell transistors connected in series between a second power source end and the output end; and means for supplying the voltage developed at the output end to the predetermined word line that is activated, wherein the first dummy cell transistors and the second dummy cell transistors are manufactured in the same manufacturing process. Preferably, each of the memory cell transistors stores therein data, composed at least two bits, with a threshold voltage thereof, wherein the threshold voltage of the first dummy cell transistors is substantially equal to the threshold voltage corresponding to predetermined data stored in the memory cell transistors, and wherein the threshold voltage of the second dummy cell transistors is substantially equal to the threshold voltage of data different from the predetermined data.

The present invention also provide a semiconductor storage device, wherein ion implantation is done during a manufacturing process for the memory cell transistors to set up a plurality of threshold values exceeding a range of a power source voltage.

BRIEF DESCRIPTION OF THE DRAWINGS

Other features and advantages of the invention will be made more apparent by the detailed description hereunder, taken in conjunction with the accompanying drawings, wherein:

FIG. 9 is a diagram showing the relation between the word line voltage and the ON/OFF status of the memory cell transistors each storing therein two-bit data.

DESCRIPTION OF THE PREFERRED EMBODIMENTS

Before describing the semiconductor storage device used in an embodiment according to the present invention, the technology related to the present invention will be described.

Figure 5:
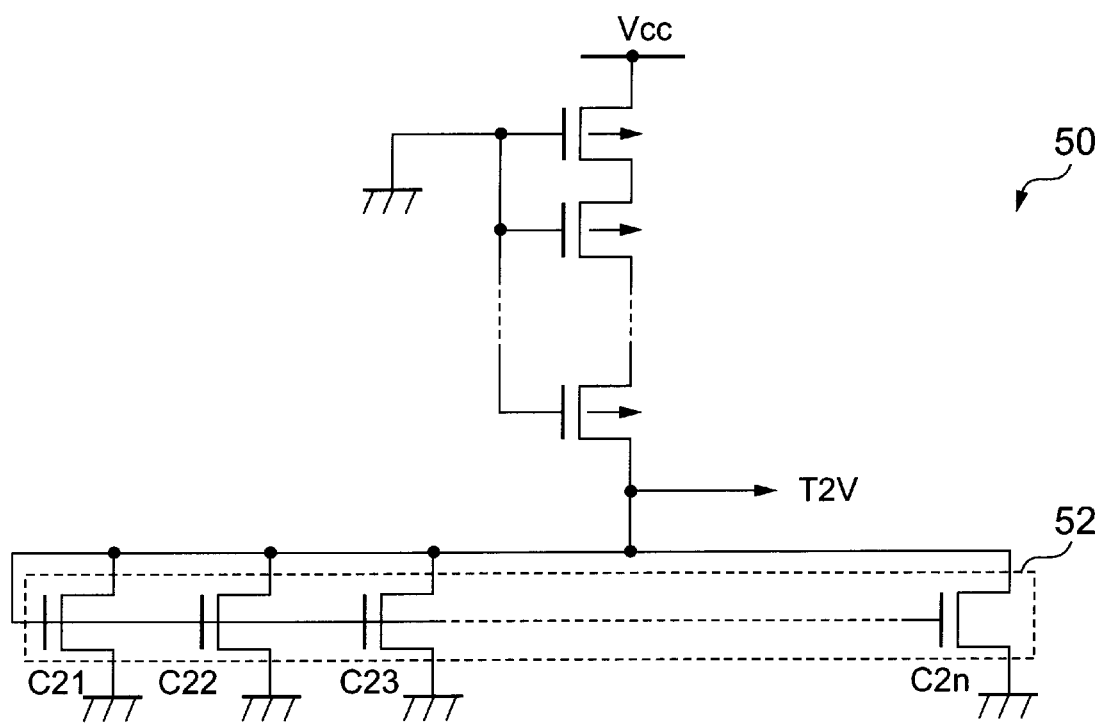
FIG. 5 is a circuit diagram showing a reference voltage generation circuit 50 according to the related technology of the present invention.

FIG. 5 is a circuit diagram of a reference voltage generation circuit 50 used in the technology related to the present invention. The reference voltage generation circuit 50 is a circuit which generates the T2V voltage used in a mask ROM storing two-bit data in one memory cell transistor, that is, a circuit which generates the intermediate voltage between the threshold voltages Vt1 and Vt2.

More specifically, the circuit connects series-connected P-channel MOS transistors and parallel-connected N-channel MOS transistors 52 between the power source Vcc and the ground GND to get the electric potential of the node point. The series connected P-channel MOS transistors are those manufactured in the same process as that of the transistors constituting the peripheral circuits, each of those gates connected to the ground GND. Therefore, the series-connected P-channel MOS transistors act as resistors. On the other hand, the parallel-connected N-channel MOS transistors 52 are a plurality of dummy cell transistors C21, C22, . . . , C2n which are manufactured in the same process as that of memory cell transistors. The threshold of those transistors is therefore the same as that of a memory cell transistor with the threshold of Vt2.

For this reason, the reference voltage T2V is slightly lower than Vt2, that is, the intermediate voltage between the threshold voltages Vt1 and Vt2. In addition, because the N-channel MOS transistors 52 which determine the voltage of the node point are manufactured in the same process as that of memory cell transistors, the reference voltage T2V becomes higher if the threshold voltage Vt2 of memory cell transistors is higher than the intended threshold voltage because of a process problem. Conversely, if the threshold voltage Vt2 is lower than the intended threshold voltage, the reference voltage T2V also becomes lower. Thus, it is possible to always generate a voltage slightly lower than the threshold voltage Vt2 of memory cell transistors.

However, in this reference voltage generation circuit 50, the reference voltage T2V is continually applied across the source and the drain of each of dummy cell transistors C21, C22, C2n which constitute the parallel N-channel MOS transistors 52. The problems that this reference voltage deteriorates dummy cell transistors in a short time. For example, when the reference voltage T2V is about 3.3 V, the voltage of about 3.3 V is continually applied across the source and the drain of each dummy cell transistor. As a result, hot carriers are sent to the gate of each dummy cell transistor, increasing the threshold voltage. The experiment conducted by the inventor of the present invention indicates that the threshold voltage of each dummy cell transistor exceeds the threshold voltage Vt2 in a few days on the average. As a result, the reference voltage T2V also exceeds the threshold voltage Vt2 of the memory cell transistor, and data cannot be read normally.

Figure 6:
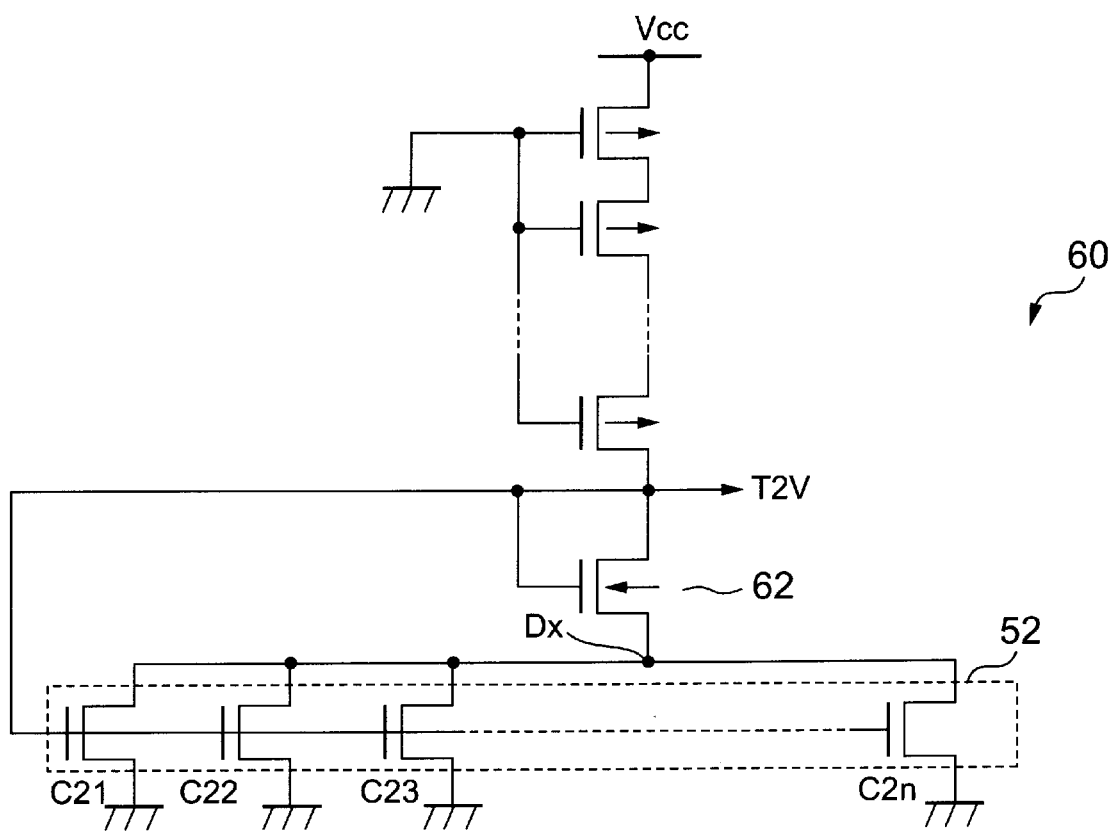
FIG. 6 is a circuit diagram showing a reference voltage generation circuit 60 according to the related technology of the present invention.

One of the methods to prevent this condition is to employ a reference voltage generation circuit 60 shown in FIG. 6. In the reference voltage generation circuit 60, an N-channel MOS transistor 62, which is manufactured in the same process as that of transistors constituting peripheral circuits, is provided between the series-connected P-channel MOS transistors and parallel-connected N-channel MOS transistors 52. This configuration makes the voltage at the node point Dx of the N-channel MOS transistor 62 and the N-channel MOS transistors 52 lower than the reference voltage T2V. As a result, the voltage across the source and the drain of each of dummy cell transistors C21, C22, . . . C2n, which constitute the parallel N-channel MOS transistors 52, falls, thus preventing hot carries from entering the gate.

As described above, the reference voltage generation circuit 60, provided as a technology related to the present invention, causes the N-channel MOS transistor 62, which is manufactured in the same process as that of transistors constituting peripheral circuits, to reduce the voltage across the source and the drain of each of dummy cell transistors. However, because peripheral circuits and memory cell arrays are usually manufactured in separate processes, the variations in transistors constituting peripheral circuits do not always match the variations in transistors constituting memory cell transistors. For this reason, if, because of a manufacturing process problem, the threshold voltage Vt2 of memory cell transistors becomes higher than the intended threshold voltage and the threshold voltage of transistors constituting the peripheral circuits becomes lower than the intended threshold voltage, the reduction effect on the voltage across the source and the drain of each dummy cell transistors constituting the N-channel MOS transistors 52 is decreased significantly.

This will be described with reference to FIG. 7.

Figure 7:
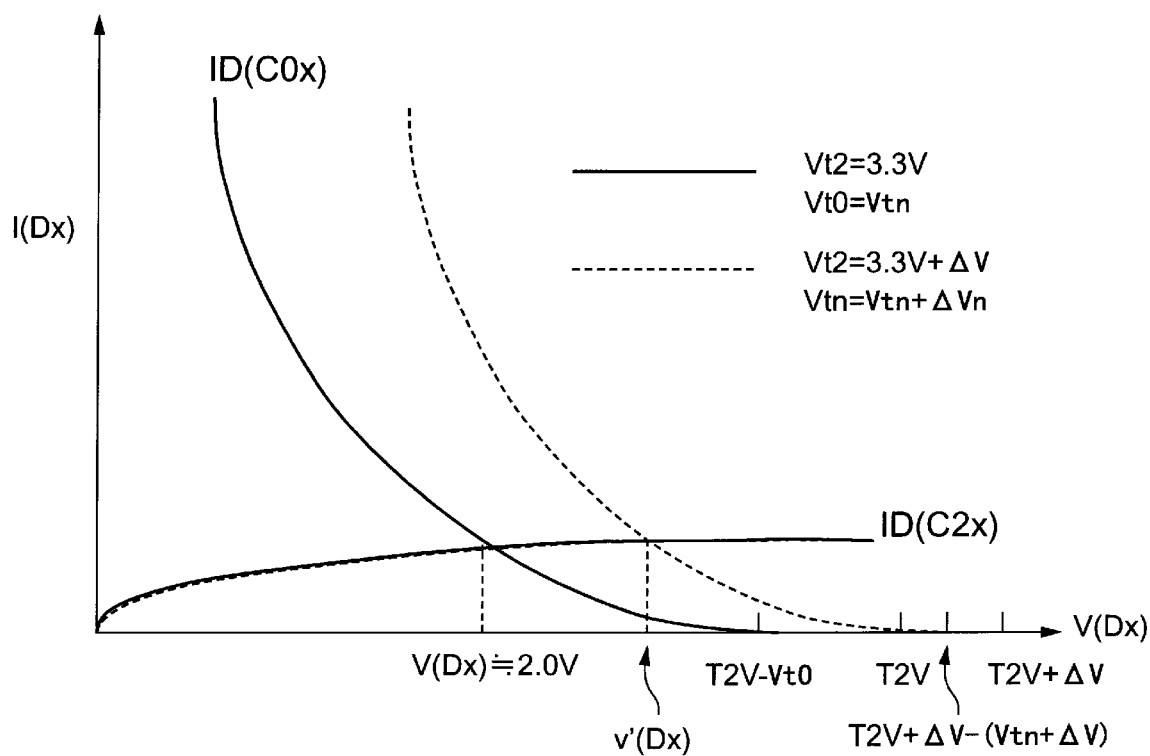
FIG. 7 is a diagram, provided to describe the problems with the reference voltage generation circuit 60 according to the related technology, showing the relation between the voltage applied to, and the current flowing through, the node point Dx.

FIG. 7 is a graph showing the relation between the current I(Dx) flowing through the node point Dx and the voltage V(Dx) at node point Dx in the reference voltage generation circuit 60. The solid line indicates the relation when there is no variation in the threshold values of both memory cell transistors and peripheral transistors, while the dashed line indicates the relation when the threshold values of memory cell transistors incline toward the positive direction and those of peripheral transistors incline toward the negative direction. In this figure, it is assumed that the threshold of the memory cell transistor Vt2=3.3 V and that threshold of the memory cell transistor Vt0=threshold of peripheral transistor Vtn.

As shown in FIG. 7, the voltage V (Dx) at node point Dx depends largely on the variations in the peripheral transistor threshold values. When the threshold values incline toward the negative direction, the voltage V(Dx) at the node point Dx becomes much higher than the intended voltage V(Dx)= about 2.0 V. This means that the variations produced during the manufacturing process greatly affect the lives of dummy transistors and greatly decrease the reliability of the product.

Next, the semiconductor storage device used in the embodiment of the present invention will be described in detail by referring to the attached drawings.

Figure 1:
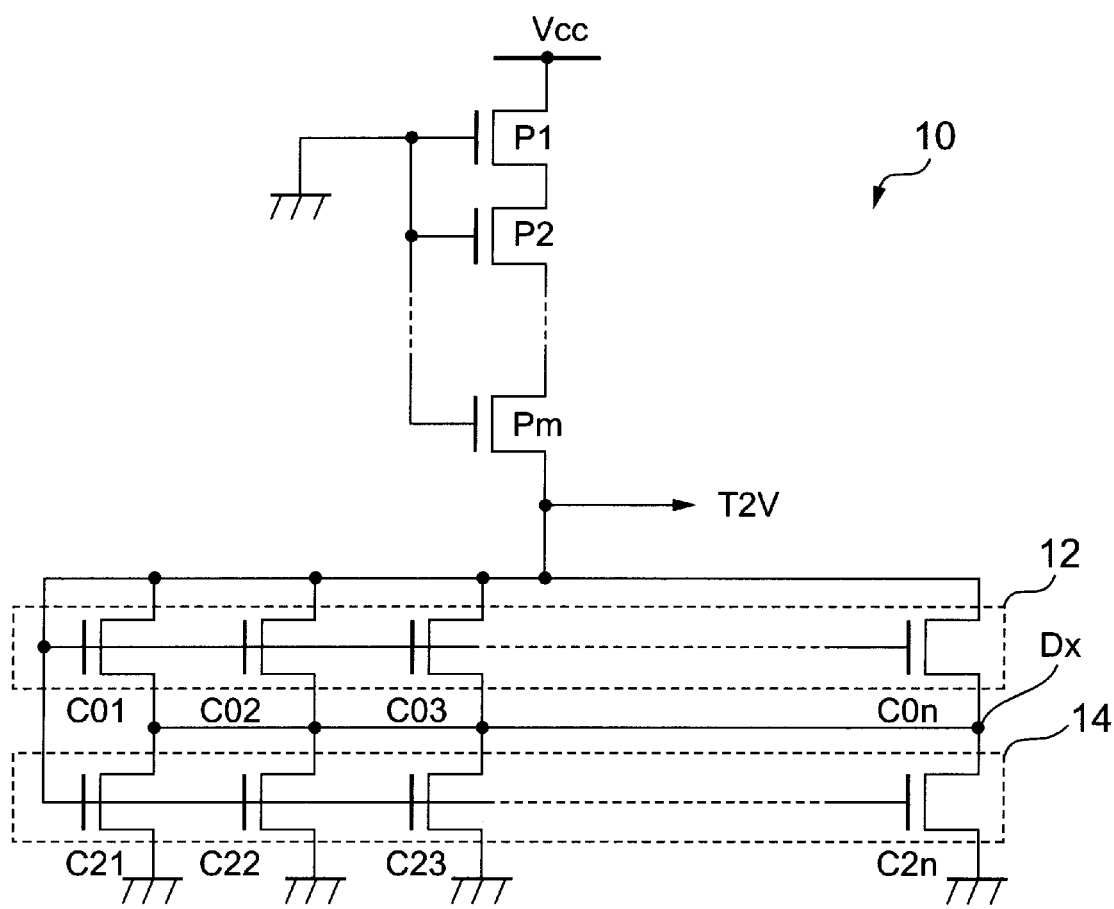
FIG. 1 is a circuit diagram showing a reference voltage generation circuit 10 used in a semiconductor storage device 100 according the present invention.

FIG. 1 is a diagram showing a reference voltage generation circuit 10 which is the nucleus of the present invention. The details will be described later. First, the overall configuration of a semiconductor storage device 100 used in this embodiment will be described.

Figure 2:
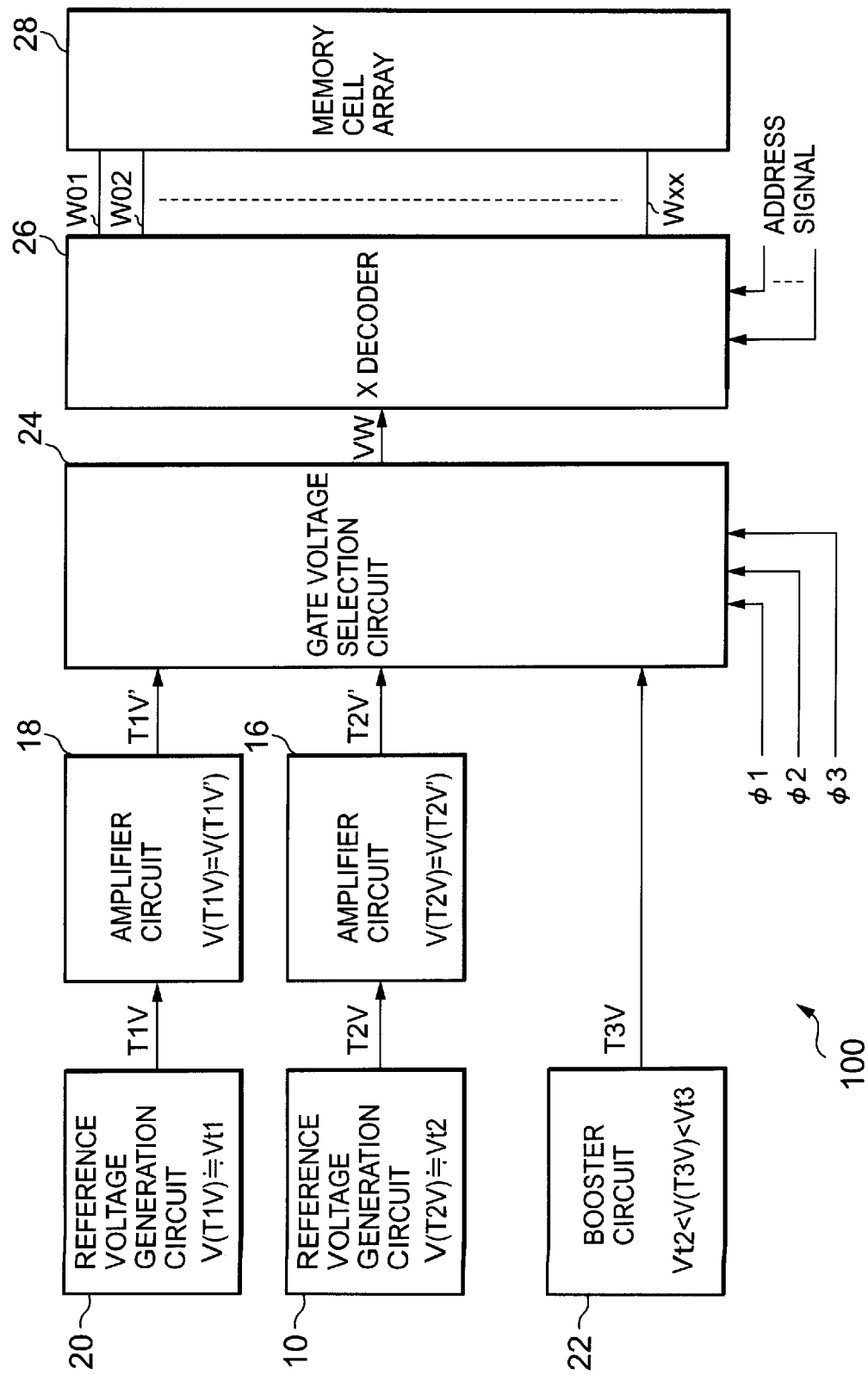
FIG. 2 is a block diagram showing the overview of the semiconductor storage device 100 according to the present invention.

FIG. 2 is a block diagram showing the general configuration of the semiconductor storage device 100 used in this embodiment. Those components not related directly to the present invention are omitted.

The semiconductor storage device 100 is a mask ROM having a memory cell array 28. Each memory cell transistor contained in the memory cell array 28 stores therein multiple-bit data (for example, two-bit data, four-bit data). Although it is assumed that, in the following description, each memory cell transistor stores two-bit data, it is to be understood that the present invention is not limited to a memory cell transistor which stores two-bit data. For example, each memory cell transistor may store four-bit data.

Because each memory cell transistor in the semiconductor storage device 100 stores two-bit data as described above, the threshold voltage of each memory cell transistor is set to one of four threshold voltages according to data to be stored. For example, when data [0, 0] is to be stored in a memory cell transistor, the threshold voltage of the memory cell transistor is set to Vt0; when data [0, 1] is to be stored in a memory cell transistor, the threshold voltage of the memory cell transistor is set to Vt1; when data [1, 0] is to be stored in a memory cell transistor, the threshold voltage of the memory cell transistor is set to Vt2; when data [1, 1] is to be stored in a memory cell transistor, the threshold voltage of the memory cell transistor is set to Vt3. Although the relation among the thresholds is not fixed, it is assumed in the following description that the relation is Vt0<Vt1<Vt2<Vt3.

Access to the memory cell array 28 composed of those memory cell transistors is made through an X decoder 26 and a Y decoder which is not shown in the figure. The X decoder 26 activates a selected word line W01, W02, . . . Wxx in response to an address signal from the external of the device. However, if there is only one voltage level that is applied to the selected word line W01, W02, . . . Wxx, it is impossible, as described above, to determine which threshold voltage, Vt0–Vt3, the selected memory cell transistor has. That is, to determine which threshold voltage the selected memory cell transistor has, the intermediate voltage (T1V) between Vt0 and Vt1, the intermediate voltage (T2V) between Vt1 and Vt2, and the intermediate voltage (T3V) between Vt2 and Vt3 must be applied, one after another, to the selected word line . This requires several circuits which supply various levels of voltage to the word line selected by the X decoder 26.

Those circuits are the reference voltage generation circuits 10 and 20, a booster circuit 22, amplifier circuits 16 and 18, and a gate voltage selection circuit 24.

The reference voltage generation circuit 20 generates the intermediate voltage (T1V) between Vt0 and Vt1, the reference voltage generation circuit 10 generates the intermediate voltage (T2V) between Vt1 and Vt2, and the booster circuit 22 generates the intermediate voltage (T3V) between Vt2 and Vt3.

In many cases, recent mask ROMs require the power source voltage of 3.3 V. However, in such a range of the power source voltage, the margin is too small to create four threshold values for a memory cell transistor and to control the word line electric potential for separating these four thresholds. Thus, the present invention provides four memory cell transistor thresholds that exceed the voltage range of the power source. More specifically, the threshold voltages are set up as Vt0=0.7 V, Vt1=1.8 V, Vt2=3.3 V, and Vt3=6 V. This separation of threshold voltages is made possible by ion implantation during the manufacturing process of the semiconductor storage device 100. The threshold voltages of memory cell transistors of the semiconductor storage device 100 are set up as described above considering the following factors. The read margin becomes larger as the interval between each two threshold voltages is larger. On the other hand, the larger the amount of ion implantation, the more difficult it is to control the thresholds through ion implantation. In addition, a threshold value, if too large, results in an increases in booster circuit size and power consumption. With these factors in mind, the threshold voltages are separated as much as possible within a range in which the threshold voltages may still be controlled through ion implantation and in which the size and the power consumption of the booster circuit are small enough. However, it is apparent that the present invention is not limited to the threshold voltages given above.

To allow data to be read from memory cell transistors for which these threshold voltages are set up, the reference voltages are set up as follows: T1V=1.7 V–1.8 V, T2V=3.2 V–3.3 V, and T3V=4.3 V. And, as described above, the reference voltage T1V is generated by the reference voltage generation circuit 20, the reference voltage T2V by the reference voltage generation circuit 10, and the reference voltage T3V by the booster circuit 22.

The reference voltages, T1V–T3V, generated by these circuits are supplied to the gate voltage selection circuit 24, and one of them is selected in response to timing signals φ1–φ3. The selected reference voltage is then supplied to the X decoder 26 as a word line driving voltage VW. The X decoder 26 supplies the word line driving voltage VW to the word line selected in response to the address signal.

The semiconductor storage device 100 has the amplifier circuit 18 between the reference voltage generation circuit 20 and the gate voltage selection circuit 24; it also has the amplifier circuit 16 between the reference voltage generation circuit 10 and the gate voltage selection circuit 24. These amplifier circuits 16 and 18, provided to increase the power, need not be provided if the power of the reference voltage generation circuits 10 and 20 is strong enough. Therefore, the reference voltages T1V and T1V' are on the same level, and the reference voltages T2V and T2V' are on the same level, respectively.

Figure 3:
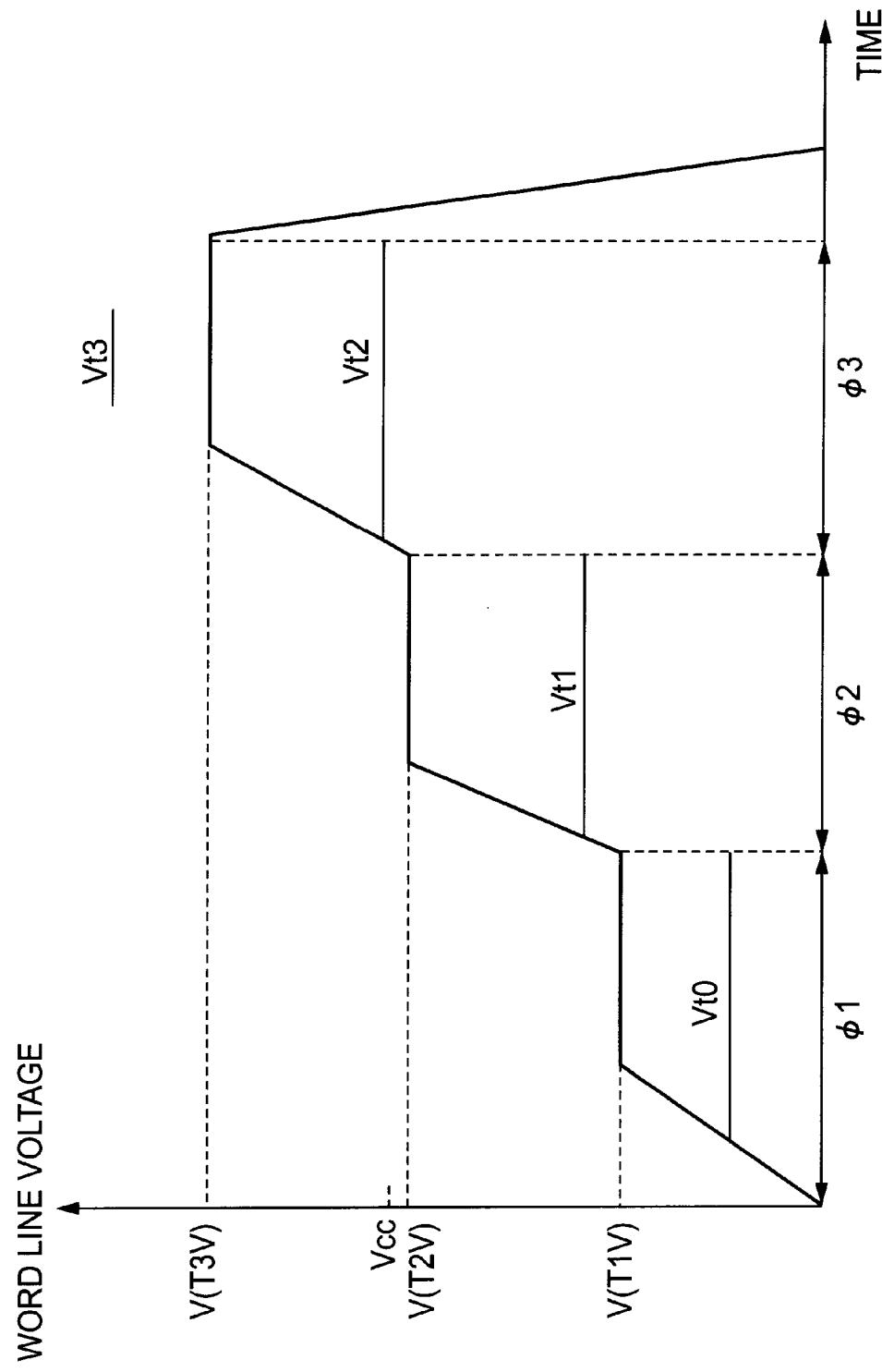
FIG. 3 is a diagram showing the voltages applied to the word lines of the semiconductor storage device 100 according to the present invention.

Next, referring to FIG. 3, how the word line driving voltage VW is applied to a selected word line will be described.

As described above, the X decoder 26 selects one of word lines W01, W02, . . . , Wxx activated by the address signal. First, in response to the timing signal φ1, the gate voltage selection circuit 24 selects the reference voltage T1V (T1V')

and supplies it to the X decoder 26. This causes the reference voltage T1V (T1V') to be applied to the word line selected by the X decoder 26. Next, in response to the timing signal φ2, the gate voltage selection circuit 24 selects the reference voltage T2V (T2V') and supplies it to the X decoder 26. Next, in response to the timing signal φ3, the gate voltage selection circuit 24 selects the reference voltage T3V and supplies it to the X decoder 26. In this manner, the reference voltage T1V (T1V'), reference voltage T2V (T2V'), and the reference voltage T3V are applied, one after another, to the word line selected by the X decoder 26.

FIG. 9 shows how to find the threshold value, Vt0–Vt3, the memory cell transistor driven by the word line has. That is, if the threshold value of the selected memory cell transistor is Vt0, it should be ON from the period during which the timing signal φ1 is active to the period during which the timing signal φ3 is active; if the threshold value of the selected memory cell transistor is Vt1, it should be OFF in the period during which the timing signal φ1 is active, and ON in the period during which the timing signals φ2 and φ3 are active; if the threshold value of the selected memory cell transistor is Vt2, it should be OFF in the period during which the timing signals φ1 and φ2 are active, and ON in the period during which the timing signal φ3 is active; if the threshold value of the selected memory cell transistor is Vt3, it should be OFF from the period during which the timing signal φ1 is active to the period during which the timing signal φ3 is active. A sense amplifier, which is not shown in the figure, detects the ON/OFF state to read the threshold value of the selected memory cell transistor, that is, data stored therein.

Returning to FIG. 1, the reference voltage generation circuit 10, the nucleus of the present invention, will be described.

As described above, the word line voltage generation circuit 10 is a circuit which generates the reference voltage T2V, that is, the intermediate voltage between the threshold voltages Vt1 and vy2.

More specifically, the reference voltage generation circuit 10 comprises a plurality of series-connected P-channel MOS transistors P1, P2, . . . Pm between the power Vcc and the ground GND, parallel-connected N-channel MOS transistors 12, and parallel-connected N-channel MOS transistors 14. The circuit generates the reference voltage T2V at the node point between the series-connected P-channel MOS transistors P1, P2, . . . Pm and the N-channel MOS transistors 12.

The series-connected P-channel MOS transistors P1, P2, . . . Pm are those manufactured in the same process as that of the transistors constituting the peripheral circuits, with each of those gates connected to the ground GND. Therefore, the P-channel MOS transistors P1, P2, . . . Pm act as resistors. The number of series-connected P-channel MOS transistors is determined considering the driving power and the power consumption of the transistors. For example, 5 to 7 those transistors are used.

The parallel-connected N-channel MOS transistors 12 are composed of a plurality of dummy cell transistors C01, C02, . . . C0n manufactured in the same process as that of memory cell transistors, and their threshold is equal to that of a memory cell transistor with the threshold of Vt0. That is, those dummy cell transistors are manufactured at the same time the memory cell transistors in the memory cell array 28 are manufactured. Those dummy cell transistors have the threshold of Vt0, because ion implantation is done for them at the same time it is done for memory cell transistor with the threshold of Vt0. The number of parallel-connected dummy transistors is determined considering the driving power and the power consumption of the transistors. For example, 10 transistors are used.

The N-channel MOS transistors 14 are also composed of a plurality of dummy cell transistors C21, C22, . . . C2n manufactured in the same process as that of memory cell transistors, and their threshold is equal to that of a memory cell transistor with the threshold of Vt2. That is, those dummy cell transistors are manufactured at the same time the memory cell transistors in the memory cell array 28 are manufactured. Those dummy cell transistors have the threshold of Vt2, because ion implantation is done for them at the same time it is done for memory cell transistor with the threshold of Vt2. The number of parallel-connected dummy transistors is determined considering the driving power and the power consumption of the transistors. For example, 10 transistors are used. Although not always required, the number of dummy cell transistors included in the N-channel MOS transistors 12 is preferably equal to the number of dummy cell transistors included in the N-channel MOS transistors 14. In this embodiment, both are 10 as described above.

The gates of all those transistors are connected to the output node point where the reference voltage T2V is generated.

Therefore, the reference voltage T2V, which is determined by the threshold voltage of the dummy cell transistors constituting the N-channel MOS transistors 14, is slightly lower than Vt2, that is, the intermediate voltage between the threshold voltages Vt1 and Vt2. In addition, the N-channel MOS transistors 14 are manufactured in the same process as that of memory cell transistors. Therefore, if the threshold voltage Vt2 of memory cell transistors becomes higher than the intended threshold voltage because of a problem during the process, the reference voltage T2V also increases. Conversely, if the threshold voltage Vt2 becomes lower than the intended threshold voltage, the reference voltage T2V also decreases. Therefore, the reference voltage T2V is always slightly lower than the threshold voltage Vt2 of memory cell transistors.

The voltage across the source and the drain of the dummy cell transistors C21, C22, . . . C2n constituting the parallel-connected N-channel MOS transistors 14 is reduced by the N-channel MOS transistors 12. That is, because the dummy cell transistors C01, C02, . . . C0n constituting the N-channel MOS transistors 12 are manufactured in the same process as that of memory cell transistor with the threshold of Vt0 as described above, the voltage at the node point Dx between the N-channel MOS transistors 12 and the N-channel MOS transistors 14 becomes lower than the reference voltage T2V by more than the threshold of Vt0. For this reason, the voltage applied across the source and the drain of dummy cell transistors C21, C22, . . . C2n constituting the N-channel MOS transistors 14 is about 2.0 V.

Figure 8:
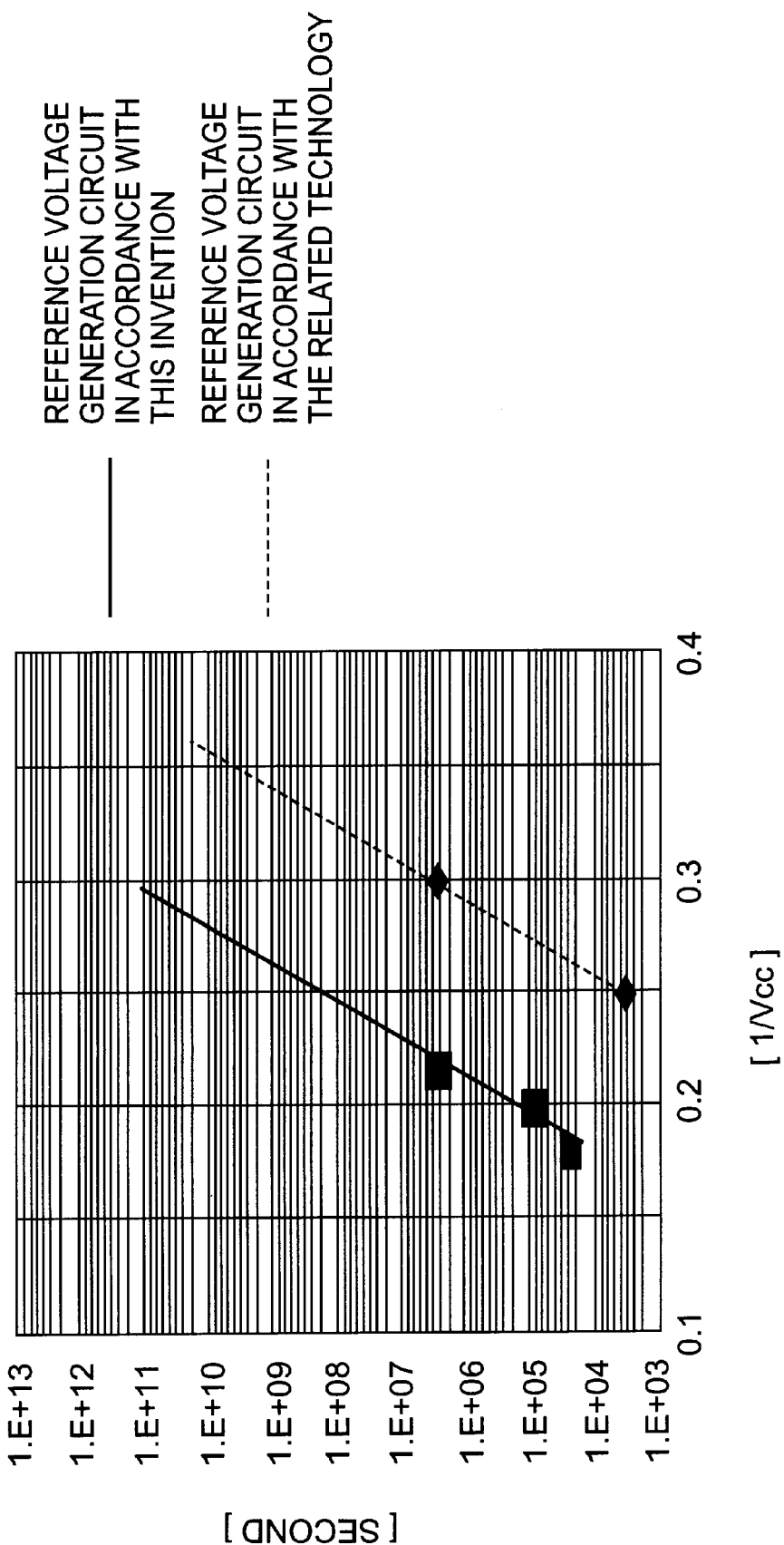
FIG. 8 is a graph showing the relation between the power source electric potential Vcc and the life of the reference voltage generation circuit.

FIG. 8 shows the effect of reduction in the voltage across the source and the drain.

FIG. 8 is a graph showing the life of a dummy cell transistor in two cases: in one case, no voltage reduction is done across the source and the drain (reference voltage generation circuit 50 according to the related technology) and, in the other case, voltage reduction is done across the source and the drain (reference voltage generation circuit 10 according to the present invention). The graph shows the reference voltage generation circuit 10 has a significant effect. That is, when the power source potential is Vcc=3.3

V (1/Vcc=0.3), the life of a dummy cell transistor in the reference voltage generation circuit 50 according to the related technology, where no voltage reduction is done across the source and the drain, is on the order of several days to several weeks. On the other hand, the life of a dummy cell transistor in the reference voltage generation circuit 10 according to the present invention, where voltage reduction is done across the source and the drain, is more than several thousands of years.

Figure 4:
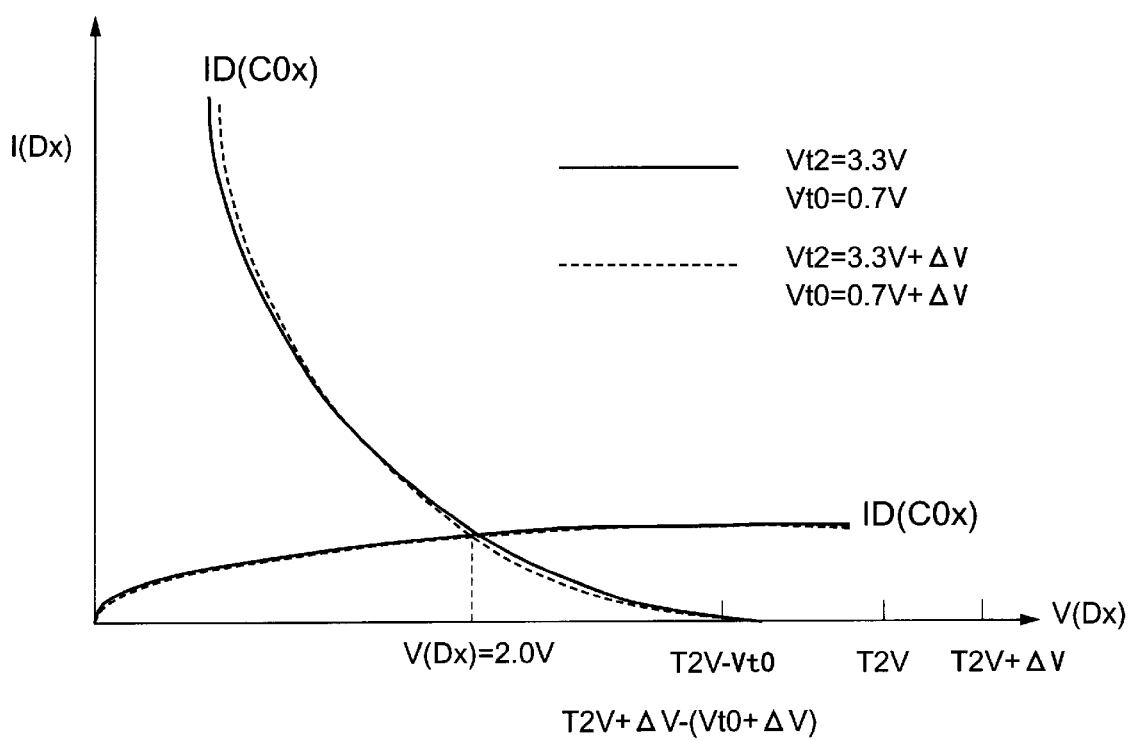
FIG. 4 is a graph, provided to describe the effect of the present invention, showing the relation between the voltage applied to, and the current flowing through, the node point Dx.

In addition, to reduce the voltage across the source and the drain of dummy cell transistors constituting the N-channel MOS transistors 14 in the reference voltage generation circuit 10, the N-channel MOS transistors 12 which are manufactured in the same process as that of those dummy cell transistors are used. Therefore, the deviation in the variations in the N-channel MOS transistors 14 always match that in the variations in the N-channel MOS transistors 12, meaning that the variations do not affect the reduction effect on the voltage across the source and the drain of dummy cell transistors. For example, when the threshold voltage of the dummy cell transistors C21, C22, . . . C2n constituting the N-channel MOS transistors 14 is higher than the intended threshold voltage Vt2 (that is, Vt2+$\Delta$V), the threshold voltage of the dummy cell transistors C01, C02, . . . C0n constituting the N-channel MOS transistors 12 should also be Vt0+$\Delta$V which is higher than the intended threshold voltage Vt0. Conversely, when the threshold voltage of the dummy cell transistors C21, C22, . . . C2n constituting the N-channel MOS transistors 14 is lower than the intended threshold voltage Vt2 (that is, Vt2−$\Delta$V), the threshold voltage of the dummy cell transistors C01, C02, . . . C0n constituting the N-channel MOS transistors 12 should also be Vt0−$\Delta$V which is lower than the intended threshold voltage Vt0. Therefore, the difference between both threshold voltages, that is, the amount of voltage reduction, remains constant. FIG. 4 shows this condition. Unlike the reference voltage generation circuit 60 according to the related technology where the N-channel MOS transistor 62 used in the peripheral circuit is used to reduce the voltage across the source and the drain of the dummy cell transistors, the figure shows that the electric potential at the node point Dx is very stable.

In addition, when the threshold voltage of the dummy cell transistors C21, C22, . . . C2n, constituting the N-channel MOS transistors 14 is higher than the intended threshold voltage Vt2 (that is, Vt2+$\Delta$V), the reference voltage T2V also increases accordingly. In this case, the threshold voltage of the memory cell transistors in the memory cell array 28 should also be higher than the intended threshold voltage because of the deviation in the variations. Conversely, when the threshold voltage of the dummy cell transistors, C21, C22, . . . C2n, constituting the N-channel MOS transistors 14 is lower than the intended threshold voltage Vt2 (that is, Vt2−$\Delta$V), the reference voltage T2V also decreases accordingly. In this case, the threshold voltage of the memory cell transistors in the memory cell array 28 should also be lower than the intended voltage because of the deviation in the variations. This allows the reference voltage generation circuit 10 to always generate there ference voltage T2V according to the deviation in the variations in the memory cell transistors in the memory cell array 28.

The "variations" refer primarily to the differences in the threshold value caused by the difference between the gate length of manufactured transistors and the intended gate length. The longer the gate length of manufactured transistors is than the intended length, the higher the threshold voltage of the transistors is than the intended voltage; conversely, the shorter the gate length of manufactured transistors is than the intended length, the lower the threshold voltage of the transistors is than the intended voltage. In addition, "variations" refer to the difference in the performance of the transistors between chips (lots), not to the difference in the performance of the transistors on one chip. That is, "variations" do not refer to the condition in which memory cell transistors with the gate length longer than the intended gate length and memory cell transistors with the gate length shorter than the intended gate length are mixed on one chip. Instead, variations refer to the condition in which the difference in the gate length is common to all memory cell transistors on one chip; that is, "variations" refer to the condition in which the gate lengths of all transistors on one chip are longer than or shorter than the intended gate length. This condition occurs on each chip (each lot) because of manufacturing conditions.

An example of reference voltage generation circuit 20 is not given above. This circuit may be implemented, in a circuit similar to the reference voltage generation circuit 50, by setting the threshold voltage of dummy cell transistors constituting the N-channel MOS transistors 52 to Vt1. In this case, the voltage applied across the source and the drain of those dummy cell transistors is T1V (=1.7 V–1.8 V). Because there is no deterioration caused by hot carriers, there is no need for transistors which reduce the voltage across the source and the drain.

As described above, the present reduces the voltage applied across the source and the drain of dummy cell transistors with no effect of variations in the threshold voltage of memory cell transistors, making available a semiconductor storage device wit the reliable, long-life reference voltage generation circuit 10.

While the invention has been particularly shown and described with reference to preferred embodiments thereof, it will be understood by those skilled in the art that various changes in form and details may be made therein without departing from the spirit and scope of the invention. For example, although the reference voltage generation circuits 20 and 10 generate the reference voltages T1V and T2V and the booster circuit 22 generates the reference voltage T3V in the above embodiment, the reference voltage generation circuit may also generate the reference voltage T3V if the power source electric potential Vcc is relatively high. In this case, the threshold voltage of dummy cell transistors for generating the reference voltage T3V is set to Vt3. However, because the voltage applied across the source and the drain of dummy cell transistors is T3V (=4.3 V) in this case and therefore the transistors are deteriorated by hot carriers, dummy cell transistors must be provided to reduce the voltage across the source and the drain as in the reference voltage generation circuit 10.

To apply the present invention to a mask ROM in which one memory cell transistor stores four-bit data therein, it is required that dummy cell transistors with a threshold lower than that of the dummy cell transistors in the circuit for generating the reference voltages be connected according to the present invention to reduce the voltage across the source and the drain of the dummy cell transistors.

As described above, the present invention provides a semiconductor storage device which has a reliable, long-life reference voltage generation circuit, because the voltage across the source and the drain of the dummy cell transistors may be reduced with no effect of variations in the threshold voltages of the memory cell transistors.

What is claimed is:

1. A semiconductor storage device comprising:

a memory cell array composed of a plurality of memory cell transistors;

a plurality of word lines each of which selects one of said plurality of memory cell transistors;

an X decoder which activates a predetermined word line out of said plurality of word lines in response to an address signal; and means for supplying a reference voltage to said predetermined word line that is activated, wherein said means for supplying the reference voltage comprises:

resistor means connected between a first power source end and an output end;

first and second dummy cell transistors connected in series between a second power source end and said output end; and means for supplying the voltage developed at said output end to said predetermined word line that is activated, and wherein said first dummy cell transistors and said second dummy cell transistors are manufactured in a same manufacturing process, wherein each of said memory cell transistors stores therein data, composed of at least two bits, with a threshold voltage thereof, wherein the threshold voltage of said first dummy cell transistors is substantially equal to the threshold voltage corresponding to predetermined data stored in said memory cell transistors, and wherein the threshold voltage of said second dummy cell transistors is substantially equal to the threshold voltage of data different from said predetermined data.

2. A semiconductor storage device comprising:

a memory cell array composed of a plurality of memory cell transistors;

a plurality of word lines each of which selects one of said plurality of memory cell transistors;

an X decoder which activates a predetermined word line out of said plurality of word lines in response to an address signal; and means for supplying a reference voltage to said predetermined word line that is activated, wherein said means for supplying the reference voltage comprises:

resistor means connected between a first power source end and an output end;

first and second dummy cell transistors connected in series between a second power source end and said output end; and means for supplying the voltage developed at said output end to said predetermined word line that is activated, and wherein said first dummy cell transistors and said second dummy cell transistors are manufactured in a same manufacturing process, wherein ion implantation is done during a manufacturing process for the memory cell transistors to set up a plurality of threshold values exceeding a range of a power source voltage.

3. A semiconductor storage device comprising:

a memory cell array having a plurality of memory cell transistors;

a plurality of word lines each of which word lines selects one of said plurality of memory cell transistors;

a reference voltage generating circuit supplying a reference voltage to a predetermined word line that is activated, said reference voltage generating circuit having a load resistor connected between a first power source end and an output end, first and second dummy cell transistors connected in series between a second power source end and said output end; and a decoder driving the predetermined word line out of said plurality of word lines by said voltage developed at said output end in response to an address signal;

wherein each of said memory cell transistors stores therein data, composed of at least two bits, with a threshold voltage thereof, wherein the threshold voltage of said first dummy cell transistor is substantially equal to the threshold voltage corresponding to a predetermined data stored in said memory cell transistors, and wherein the threshold voltage of said second dummy cell transistor is substantially equal to the threshold voltage of data different from said predetermined data.

4. The device as claimed in claim 3, wherein said load resistor includes at least one transistor.

5. The device as claimed in claim 3, wherein said first dummy cell transistor includes a predetermined number of first transistors, and each of said first transistors is connected between said output end and a common node and each of said first transistors has a gate connected to said output end.

6. The device as claimed in claim 5, wherein said second dummy cell transistor includes said predetermined number of second transistors, and each of said second transistors is connected between said output end and a common node and each of said second transistors has a gate connected to said output end.

* * * * *